(12) United States Patent
Zhang et al.

(10) Patent No.: US 9,171,912 B2
(45) Date of Patent: Oct. 27, 2015

(54) GROUP IV ELEMENT DOPED P-TYPE ZN(MG,CD,BE)O(S,SE) SEMICONDUCTOR

(75) Inventors: Jizhi Zhang, Walnut, CA (US); Jin Joo Song, Brea, CA (US)

(73) Assignee: ZN TECHNOLOGY, INC., Brea, CA (US)

( * ) Notice: Subject to any disclaimer, the term of this patent is extended or adjusted under 35 U.S.C. 154(b) by 0 days.

(21) Appl. No.: 12/944,227

(22) Filed: Nov. 11, 2010

(65) Prior Publication Data

US 2012/0119203 A1    May 17, 2012

(51) Int. Cl.
*H01L 29/12* (2006.01)
*H01L 29/22* (2006.01)

(52) U.S. Cl.
CPC ................... *H01L 29/22* (2013.01)

(58) Field of Classification Search
CPC ........................................... H01L 29/22
USPC .......................... 257/614, E29.094
See application file for complete search history.

(56) References Cited

U.S. PATENT DOCUMENTS

| | | | |
|---|---|---|---|
| 6,527,858 B1 * | 3/2003 | Yoshida et al. | 117/108 |
| 7,741,637 B2 | 6/2010 | Nakahara et al. | |
| 2008/0073658 A1 | 3/2008 | Wirth | |
| 2010/0237343 A1 | 9/2010 | Nakahara et al. | |

OTHER PUBLICATIONS

Luo, J. T. et al. "The Electrical, Optical and Magnetic Properties of Si-doped ZnO Films." Applied Surface Science, Feb. 2011, vol. 258, pp. 2177-2181.
Minami T. et al, "Highly Conductive and Transparent Silicon Doped Zinc Oxide Thin Films Prepared by RF Magnetron Sputtering." Japanese Journal of Applied Physics, Sep. 1986, vol. 25, pp, L776-L779.
Mita, Y. et al. "Photoluminescence Characteristics of Pb-doped, Molecular-Beam-Epitaxy Grown ZnSe Crystal Layers." Journal of Applied Physics, Aug. 2004, Vol, 96, pp, 1904-1908.
Mita, Y. et al. "PL Characteristics of MBE-grown, Pb-doped ZnSe Crystal Layers." Journal of Crystal Growth, 2003, vol. 51, pp. 576-580.
International Search Report on related PCT application (PCT/US2011/060622) from International Searching Authority (KIPO) dated May 21, 2012.
Written Opinion on related PCT application (PCT/US2011/060622) from International Searching Authority (KIPO) dated May 21, 2012.

* cited by examiner

*Primary Examiner* — Thien F Tran
(74) *Attorney, Agent, or Firm* — Klein, O'Neill & Singh, LLP

(57) ABSTRACT

A p-type group II-VI semiconductor may include a group IV element as a dopant. The group II-IV semiconductor may be $Zn_{1-a-b-c}Mg_aCd_bBe_cO_{1-p-q}S_pSe_q$, wherein $a=0\sim1$, $b=0\sim1$, $c=0\sim1$, $p=0\sim1$ and $q=0\sim1$.

11 Claims, 6 Drawing Sheets

Table 1

| I (μA) | 1 | 2 | 4 | 8 |
|---|---|---|---|---|
| μ (cm$^2$/V·s) | 2.57 | 2.14 | 1.87 | 1.73 |
| ρ (ohm·cm) | 3.193 | 3.238 | 3.267 | 3.312 |
| N (1/cm$^3$) | 7.60 × 10$^{17}$ | 9.02 × 10$^{17}$ | 1.02 × 10$^{18}$ | 1.09 × 10$^{18}$ |
| Type | P | P | P | P |

FIG. 5

Table 2

| $I(\mu A)$ | 10 | 50 | 100 |
|---|---|---|---|
| $\mu$ (cm$^2$/V.s) | 6.81 | 6.5 | 6.62 |
| $\rho$(ohm·cm) | 0.447 | 0.4471 | 0.4471 |
| N(1/cm$^3$) | $2.05 \times 10^{18}$ | $2.15 \times 10^{18}$ | $2.11 \times 10^{18}$ |
| Type | P | P | P |

FIG. 6

GROUP IV ELEMENT DOPED P-TYPE ZN(MG,CD,BE)O(S,SE) SEMICONDUCTOR

BACKGROUND OF THE INVENTION

The present invention relates generally to group II-VI semiconductors, for example for use in semiconductor devices such as light emitting diodes (LEDs), laser diodes (LDs), detectors, and transistors and more particularly to p-type group II-VI semiconductors, preferably satisfying a formula $Zn_{1-a-b-c}Mg_aCd_bBe_cO_{1-p-q}S_pSe_q$, wherein a=0~1, b=0~1, c=0~1, p=0~1, and q=0~1 and with a group IV element dopant, for example for use in said semiconductor devices.

Among said group II-VI semiconductors, the oxide semiconductors satisfying the formula $Zn_{1-a-b-c}Mg_aCd_bBe_cO$, wherein a=0~1, b=0~1, and c=0~1, especially ZnO, have recently received significant attention for use in semiconductor devices including but not limited to LEDs. LDs, photodetectors, and transistors. As a wide bandgap semiconductor having an energy gap of 3.23 eV, ZnO can cover the spectral range from visible to deep UV through use of ZnCdO, ZnMgO, and ZnBeO alloys. A notable advantage of said ZnO is its high exciton binding energy, 60 meV, which is 2.3 times of the thermal energy at room temperature (RT). As a result, light emission and detection from ZnO and most of said alloys are excitonic at and above RT. This enables higher internal quantum efficiency and thermal stability than currently available LEDs, LDs, and diode photodetectors covering the same spectral range from visible to deep UV. In addition, said ZnO is transparent in the visible spectral region, has a higher mobility than amorphous silicon, and can be deposited at temperatures lower than those for polycrystalline silicon. These make said ZnO an ideal semiconductor for fabricating transparent, thin film transistors. These transistors have many applications in transparent electronics such as flat panel display and other transparent, flexible electronic circuits.

Most members of said group II-VI semiconductors, preferably satisfying the formula $Zn_{1-a-b-c}Mg_aCd_bBe_cO_{1-p-q}S_pSe_q$, wherein a=0~1, b=0~1, c=0~1. p=0~1, and q=0~1, have a proximity or a relevance in crystal structure. The aforementioned advantages and applications related to ZnO may thus be extended to many of these members.

Since said semiconductor devices are mostly pn junction devices, n- and p-doping techniques are required to form the corresponding n- and p-type semiconductor components in said devices. Formation of n-type ZnO components is not considered to be an issue, because ZnO is known to be intrinsically n-type and several group III or VII elements in the Periodic Table of Elements, including Al, Ga, In, and F, have already been identified as effective shallow donors in ZnO. Yet, formation of reliable p-type ZnO components for use in said devices is still immature, though a few examples of doping utilizing group V elements in the ZnO films have been reported to be promising for formation of p-type films.

U.S. Pat. No. 6,624,441B2 ("Homoepitaxial Layers of p-Type Zinc Oxide and the Fabrication Thereof", H. E. Cantwell and D. B. Eason, U.S. Pat. No. 6,624,441B2, incorporated by reference herein), originally assigned to Eagle-Picher Technologies, LLP and then transferred to the assignee of this application, ZN Technology, Inc., describes a method to achieve p-type conduction in ZnO films by doping nitrogen. An embodiment of the invention uses molecular beam epitaxy (MBE) technique for the p-type ZnO film growth and employs a RF plasma source for generation of atomic nitrogen flux for the p-doping. The nitrogen atoms, after incorporation into the ZnO host lattice, form shallow acceptors in said ZnO films, resulting in p-type conduction. Using this method, p-type ZnO films having hole concentrations of $\sim 9 \times 10^{16}$ $cm^{-3}$ and mobilities of about 2 $cm^2/V \cdot s$ have been successfully grown. A well known drawback with said method to achieve p-type ZnO films is relatively low solubility of nitrogen in crystalline ZnO films or bulk crystals at elevated temperatures ("Repeated Temperature Modulation Epitaxy for p-Type Doping and Light-Emitting Diode Based on ZnO", A. Tsukazaki, A. Ohtomo, T. Onuma, M. Ohtani, T. Makino, M. Sumiya, K. Ohtani, S. F. Chichibu, S. Puke, Y. Segawa, H. Ohno, H. Koinuma, and M. Kawasaki, Nature Materials, Vol. 4, January 2005, page 42, incorporated by reference herein). As a result, p-type ZnO films or bulk crystals may only be grown at low growth temperatures using nitrogen as the p-type dopant.

Another example is shown by U.S. Pat. No. 6,342,313B1, which discloses a method to grow a p-type ZnO film on a p-type GaAs substrate using pulsed laser deposition (PLD) process ("Oxide Films and Process for Preparing Same", H. W. White, S. Zhu, and Y. Ryu, U.S. Pat. No. 6,342,313B1, incorporated by reference herein). According to the patent, the group V element As from the p-type GaAs substrate diffuses into the ZnO film during the PLD process, resulting in p-type conduction of the grown ZnO film. This method employs arsenic as the p-type dopant element. The oxide of arsenic is known to be extremely toxic to humans and therefore this method may not be environmentally friendly. In addition, said PLD process also has some difficulties in in-situ manipulation of dopant concentration and alloy composition.

In addition, Xiu, et al reported that p-type ZnO films could be grown on n-type silicon substrates by doping with another group V element, antimony, in the ZnO films using MBE ("High-Mobility Sb-Doped p-Type ZnO by Molecular-Beam Epitaxy", F. X. Xiu, Z. Yang, L. J. Mandalapu, D. T. Zhao, and J. L. Liu, Appl. Phys. Lett. 87, 152101 (2005), incorporated by reference herein). Yet the mechanism leading to the p-type conduction has not been well understood because antimony, as well as arsenic, is generally considered to form deep levels in ZnO. A model recently proposed, based on first-principles calculations by Sukit Limpijumnong et al, shows that a defect complex, two Zn vacancies teaming with an antimony (or arsenic) atom on a Zn site in the ZnO lattice, may act as a shallow acceptor, providing a possible theoretical basis for the aforementioned p-doping approach used by Xiu et al. ("Doping with Large-Size-Mismatched Impurities: The Microscopic Origin of Arsenic and Antimony-Doped p-Type Zinc Oxide", S. Limpijumnong, S. B. Zhang, S.-H. Wei, and C. H. Park, Phys. Rev. Lett. 92, 155504 (2004), incorporated by reference herein). With this approach, whether said defect complexes is reliable for long term uses in said semiconductor devices would possibly be an issue and, may need to be further examined.

In spite of some progress recently made in formation of p-type ZnO films, preferably p-type ZnO films are reliable and reproducible, have high net hole concentrations, and can be made in a wide temperature range for uses in said semiconductor devices.

Regarding the use of group V elements, a group V element in general has a significantly higher vapor pressure than a group IV element in the same row of the Periodic Table of the Elements as said group V element. Usually a dopant element having a higher vapor pressure is more difficult to be doped into a host material (said group II-VI semiconductor herein) at high temperatures than a dopant element having a lower vapor pressure. Therefore, said group V element may not be a dopant as effective as said group IV element at high temperatures, while most semiconductor devices require high crystalline p-type semiconductors that have to be formed at high temperatures.

SUMMARY OF THE INVENTION

Aspects of the invention provides a p-type ZnO-based II-VI semiconductor satisfying the formula $Zn_{1-a-b-c}Mg_aCd_bBe_cO_{1-p-q}S_pSe_q$, wherein a=0~1, b=0~1, c=0~1, p=0~1, and q=0~1, and a method for preparation thereof. Hereafter, Zn(Mg,Cd,Be)O(S,Se) is used to denote any of said group II-VI semiconductor family satisfying the formula $Zn_{1-a-b-c}Mg_aCd_bBe_cO_{1-p-q}S_pSe_q$, wherein a=0~1, b=0~1, c=0~1, p=0~1, and q=0~1.

In aspects of the present invention, said group II-VI semiconductor Zn(Mg,Cd,Be)O(S,Se) is rendered p-type by doping one or more of the group IV elements in the Periodic Table of Elements, namely C, Si, Ge, Sn, and Pb. Specifically, said p-type II-VI semiconductor Zn(Mg,Cd,Be)O(S,Se) provided by this invention not only contains majority elements including one or more of the group II elements (Zn, Mg, Cd, and Be) and one or more of the group VI elements (O, S, and Se), but also contains minority elements including one or more of the group IV elements (C, Si, Ge, Sn, and Pb), wherein said minority elements are doping impurities in said p-type group II-VI semiconductor Zn(Mg,Cd,Be)O(S,Se). The concentration of said group IV element can be in the range of $1 \times 10^{13} \sim 1 \times 10^{22}$ cm$^{-3}$. In many embodiments p-type II-VI semiconductors Zn(Mg,Cd,Be)O(S,Se) in accordance with the invention are a component or are components of related semiconductor devices including but not limited to light emitting diodes (LEDs), laser diodes (LDs), detectors, and transistors.

Aspects of the present invention further provide a method for preparing a p-type Zn(Mg,Cd,Be)O(S,Se) semiconductor by doping one or more of the group IV elements (C, Si, Ge, Sb, and Pb) into said Zn(Mg,Cd,Be)O(S,Se) semiconductor. Said Zn(Mg,Cd,Be)O(S,Se) herein can be a bulk material or a film of any shape, which may be single crystal, polycrystalline, or amorphous. The dopants can be substances of pure elemental types or compounds, containing one or more group IV elements in the Periodic Table of Elements. These group IV elements can be incorporated into said Zn(Mg,Cd,Be)O(S,Se) semiconductor by various processes including but not limited to ion implantation, diffusion, laser ablation, evaporation, chemical vapor deposition (CVD), mass transport, epitaxial growth methods including MBE, metalorganic chemical vapor deposition (MOCVD), PLD, liquid phase epitaxy (LPE), vapor phase epitaxy (VPE), and hydride vapor phase epitaxy (HVPE), and a number of bulk crystal growth methods including vapor phase, hydrothermal, and melt growth methods. For those knowing skilled art, other similar methods may be used to incorporate said group IV elements into said Zn(Mg,Cd,Be)O(S,Se) semiconductor.

In one specific embodiment, said p-type semiconductor Zn(Mg,Cd,Be)O(S,Se) is a thin film and is epitaxially grown on a substrate using an MOCVD process that comprises thermal and chemical processes. Said substrate is preferably an n-type silicon substrate, either undoped or doped with phosphorus or arsenic, having at least one polished surface. It is chemically cleaned for removal of the native oxide on the polished side and then immediately loaded into an MOCVD reactor for said MOCVD process. Said MOCVD process takes place at a specific growth temperature and a specific growth pressure with a purging gas. The growth temperature can be one greater than 250° C., preferably, while the preferred growth pressure is greater than 1 Torr. The purging gas is preferably nitrogen, but could be others including but not limited to argon, helium, hydrogen, etc. In the beginning of the epitaxial growth, the process gases containing Zn and O, and optionally containing one or more of Mg, Cd, Be, S, and Se, are introduced into the reactor along with a dopant gas, preferably silane, which comprises said group IV element silicon. These process gases, along with the dopant gas, are thermally decomposed and chemically react, forming said p-type Zn(Mg,Cd,Be)O(S,Se) semiconductor film doped with said group IV element, herein silicon preferably, on said silicon substrate. Usually, a thermal annealing is required to remove most of hydrogen content in the film, which is often unintentionally incorporated during the MOCVD process. Hydrogen is commonly known to be a donor in many Zn(Mg,Cd,Be)O(S,Se) semiconductors, for example ZnO, and should preferably be removed to enable p-type conduction. The annealing temperature is preferably in the range from 300° C. to 1000° C. in this specific embodiment.

Other systems, methods, features and advantages of the invention will be or become apparent to one with skill in the art upon examination of this disclosure, including the figures and detailed description. It is intended that all such additional systems, methods, features and advantages be included within this description, be within the scope of aspects of the invention, and the novel and unobvious aspects be protected by the accompanying claims.

BRIEF DESCRIPTION OF THE DRAWINGS

Aspects of the invention can be better understood with reference to the accompanying figures and tables. The components in the figures are not necessarily to scale, with emphasis instead being placed upon illustrating the principle aspects of the invention. In the figures, like reference numerals designate corresponding parts throughout the different views.

FIG. 5 shows a table labeled as Table 1 which includes data from room temperature Hall measurements of a p-type ZnO film grown in accordance with a specific embodiment of this invention.

FIG. 6 shows a table labeled as Table 2 which includes data from room temperature Hall measurements of a p-type ZnO film grown in accordance with an alternative embodiment of this invention.

DETAILED DESCRIPTION

Figure 1:
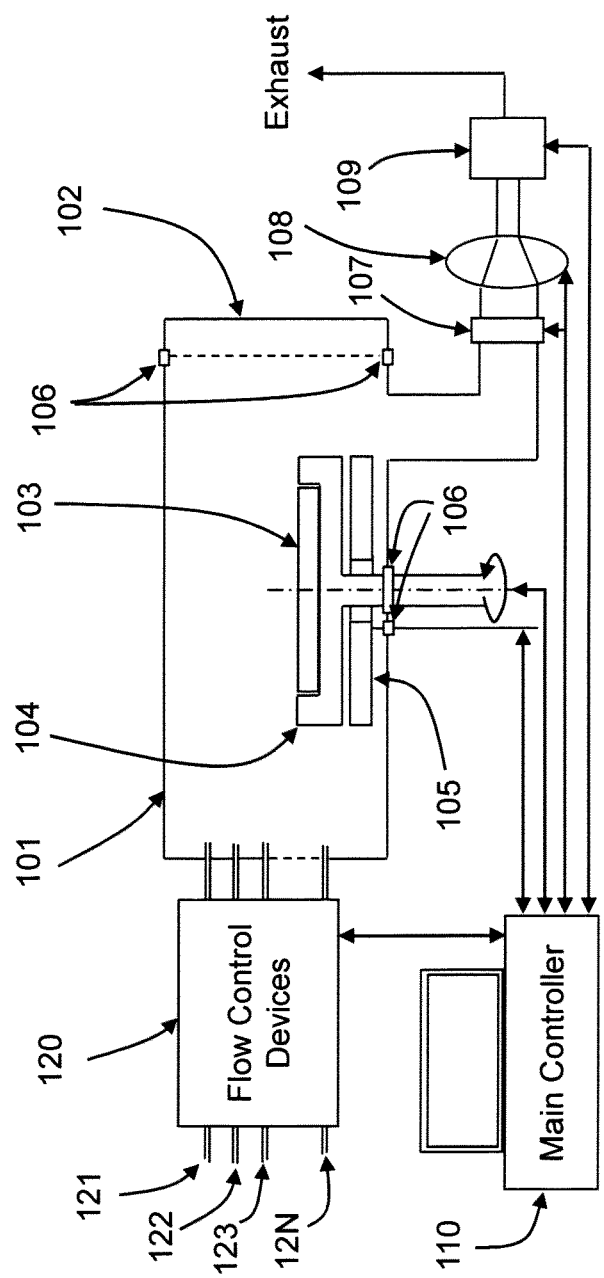
FIG. 1 is a schematic diagram of an apparatus, namely an MOCVD system, suitable for practicing methods in accordance with aspects of this invention.

Aspects of the present invention provide a p-type ZnO-based II-VI semiconductor denoted as Zn(Mg,Cd,Be)O(S,Se). Another aspect of the present invention provide a method for preparation of said p-type Zn(Mg,Cd,Be)O(S,Se). Said p-type Zn(Mg,Cd,Be)O(S,Se) can be a thin film or a bulk material of any shape and may be single crystal, polycrystalline, or amorphous. It may be used in the manufacture of Zn(Mg,Cd,Be)O(S,Se) semiconductor devices, including but not limited to LEDs. LDs, photodetectors, and transistors. Herein, Zn(Mg,Cd,Be)O(S,Se) represents any of the group II-VI semiconductors satisfying the formula $Zn_{1-a-b-c}Mg_aCd_bBe_cO_{1-p-q}S_pSe_q$, wherein $a=0\sim1$, $b=0\sim1$, $c=0\sim1$, $p=0\sim1$, and $q=0\sim1$, with ZnO being the most typical one.

Generally speaking, a semiconductor is rendered p-type when the hole concentration is greater than the electron concentration and n-type when the electron concentration is greater than the hole concentration. To achieve a p-type semiconductor, the semiconductor is often doped with controlled amounts of specified impurities, yielding a sufficient concentration of holes to make the holes the majority carriers in the semiconductor. In accordance with aspects of the present invention, said impurities in said Zn(Mg,Cd,Be)O(S,Se) sufficient to make the holes the majority carriers are composed of Si, preferably, or in various embodiments are composed of one or more of other group IV elements in the Periodic Table of Elements, namely C, Ge, Sn, and Pb. By doping with a sufficient amount of said impurities composed of Si or one or more of other group IV elements in the Periodic Table of Elements in said semiconductor Zn(Mg,Cd,Be)O(S,Se), said semiconductor Zn(Mg,Cd,Be)O(S,Se) can be rendered p-type. The total concentration of said impurities in said semiconductor Zn(Mg,Cd,Be)O(S,Se) can be in the range of $1\times10^{13}\sim1\times10^{22}$ cm$^{-3}$ achieve p-type conduction.

Said impurities can be contained in various forms, either pure elemental types or compounds, which are usually termed as dopants. For examples of achieving p-type ZnO using said Si element as the doping impurity, the dopants can be pure Si, SiH$_4$ (silane), Si$_2$H$_6$ (disilane), or other compounds containing the silicon elements. These dopants are usually referred as p-dopants since they result in p-type semiconductors, p-type ZnO in this case. In some embodiments, the p-dopants may be in a diluted form. As an example, a diluted, 50 ppm SiH$_4$ gas is a mixture of a minor amount of pure SiH$_4$ gas with a balance gas typically of N$_2$, Ar, He, or H$_2$, wherein the molar concentration of the SiH$_4$ gas in the mixture is 50 ppm. Such a diluted p-dopant may enable precise control of the impurity level, and thus the hole concentration, in the p-type Zn(Mg,Cd,Be)O(S, Se) semiconductor to meet various requirements of said semiconductor devices.

Metalorganic chemical vapor deposition (MOCVD) is one of various methods suitable for forming a p-type Zn(Mg,Cd,Be)O(S,Se) semiconductor. Said MOCVD method is an in situ doping and film growth process. With the MOCVD method or process, said group IV doping element or elements can be doped into the host Zn(Mg,Cd,Be)O(S,Se) films during the times when the host Zn(Mg,Cd,Be)O(S,Se) films are grown. The dopants are typically gases such as said diluted silane. In general, said dopant gas or gases are introduced into the reactor chamber 101 of the MOCVD system with other gas precursors containing the host elements of said Zn(Mg,Cd,Be)O(S,Se) films. In the MOCVD reactor chamber 101, a substrate 103 is heated to an optimized temperature, herein termed as the growth temperature, suitable for said in situ doping and film growth process. As a result of a set of procedures including thermal decompositions and chemical reactions, the p-type Zn(Mg,Cd,Be)O(S,Se) film is formed on the substrate 103.

Said MOCVD method becomes clearer by referring to FIG. 1, which shows a schematic drawing of an MOCVD system which may be used in forming a p-type Zn(Mg,Cd,Be)O(S,Se) semiconductor. The MOCVD system comprises a reactor chamber 101, a main electronic controller 110, a gas supply subsystem containing flow control devices 120, a pressure control subsystem containing a dry pump 108 and a throttle valve 107, and a waste gas scrubber 109. The core of the MOCVD system is the reactor chamber 101, wherein a heater 105 and a rotatable substrate susceptor 104 are housed.

The heater 105 along with the main controller 110 facilitates growth temperature control for said p-doping and film growth on a substrate 103 (usually a wafer) placed on the susceptor 104. A reactor door 102 is provided for the reactor chamber 101, and is a port for loading and unloading the substrate 103. Referring to FIG. 1, a sealing gasket 106 prevents gas-leaking at joints about the reactor door. Process gases specifically for growth of a p-type Zn(Mg,Cd,Be)O(S,Se) film, including the precursors for the host Zn(Mg,Cd,Be)O(S,Se) film, the dopant or dopants, and the purging gases, are injected into the reactor chamber 101 through a series of gas lines, 121 to 12N as indicated in FIG. 1. The flow routing and the molar flow rates of these gases are precisely controlled with a number of flow control devices 120 comprising valves, mass flow controllers (MFCs), and pressure regulators. Said precursors, dopants, and, at times, the purging gases react in the reactor chamber 101 at a temperature and pressure specifically for the p-type Zn(Mg,Cd,Be)O(S,Se) film growth process, resulting in said p-type Zn(Mg,Cd,Be)O(S,Se) film formed on the substrate 103. The pressure control subsystem including the dry pump 108 and the throttle valve 107 sets and controls the reactor pressure suitable for the p-type Zn(Mg,Cd,Be)O(S, Se) film growth process. The waste gases from the reactor chamber 103 are processed by the scrubber 109 to eliminate any environmentally harmful gas components for exhaust. The main controller 110 is the data processing center, processing and coordinating electronic instructions necessary for the p-type film growth.

Figure 2:
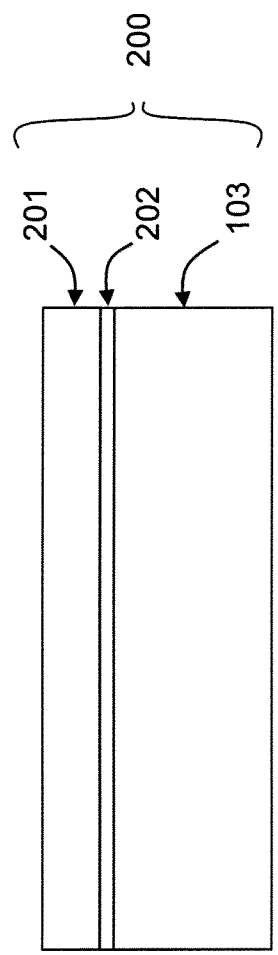
FIG. 2 is a cross-sectional diagram showing a p-type Zn(Mg,Cd,Be)O(S,Se) film grown on a substrate using a method in accordance with aspects of this invention.

In some embodiments, a thin buffer layer 202 may be deposited on said substrate 103 prior to formation of the p-type Zn(Mg,Cd,Be)O(S,Se) film 201, as schematically shown in FIG. 2. This buffer layer can be formed by MOCVD, MBE, VPE, thermal evaporation, e-beam evaporation, PLD, or sputtering. Other deposition methods may also be used. Although said thin buffer layer is primarily to improve the crystallinity of the p-type Zn(Mg,Cd,Be)O(S,Se) film 201 grown thereon, it may also act as a p-doping source if it contains said p-doping impurities such as the group IV elements in the Periodic Table of Elements. At elevated temperatures, the impurity or impurities in the thin buffer layer diffuse into the Zn(Mg,Cd,Be)O(S,Se) film grown thereon to form the p-type Zn(Mg,Cd,Be)O(S,Se) film 201. The material of the buffer layer can comprise one of any of nitride semiconductors satisfying the formula $Al_xGa_yIn_{1-x-y}N$, inclusive of $x=0$, $y=0$, and $x=y=0$, Zn(Mg,Cd,Be)O(S,Se), Si, Ge, Si$_x$Ge$_{1-x}$ (where $x=0\sim1$), silicon nitride, silicon oxide, silicon carbide, zirconium nitride, zirconium oxide, zirconium carbide. LiAl$_x$Ga$_{1-x}$O$_2$ (where $x=0\sim1$), SrTiO$_3$, MgAl$_2$O$_4$, ScAlMgO$_4$ and other materials that will promote improved crystallinity and enhance p-type doping.

Generally there are various types of substrates that can be employed for the growth of the p-type Zn(Mg,Cd,Be)O(S,Se) film 201. These substrates include, but are not limited to, diamond, sapphire, Si, SiC, Si$_x$Ge$_{1-x}$ (where $x=0\sim1$), Ge, Zn(Mg,Cd,Be)O(S,Se), ZrO$_2$, LiAl$_x$Ga$_{1-x}$O$_2$ (where $x=0\sim1$), SrTiO$_3$, MgAl$_2$O$_4$, ScAlMgO$_4$, Al$_{1-x-y}$In$_x$Ga$_y$N (where $x=0\sim1$, $y=0\sim1$), InP, GaAs, quartz, and glass. In some embodiments, the substrate may be engineered to have some special functionality. For example, the substrate may comprise a compliant material so that materials lattice-mismatched to the substrate grown thereon have high crystallinity. Such a substrate is usually called a compliant substrate, which is attainable by attaching at least one elastic layer on the top of a regular substrate. The elastic layer can be GaAs (see, e.g., "Growth of InGaAs Multi-Quantum Wells at 1.3 µm Wavelength on GaAs Compliant Substrates", Z. H. Zhu, R. Zhou, F. E. Ejeckam, Z. Zhang, J. Zhang, J. Greenberg, Y.

H. Lo, H. Q. Hou and B. E. Hammons, *Appl. Phys. Lett.* 72, 2598-2600 (1998), incorporated by reference herein), $Si_xGe_{1-x}$ (x=0~1) (see, e.g., "An Effective Compliant Substrate for Low-Dislocation Relaxed $Si_{1-x}Ge_x$ Growth", Y. H. Luo, J. L. Liu, G. Jin, J. Wan, and K. L. Wang, *Appl. Phys. A* 74, 699-702 (2002), incorporated by reference herein), or other materials. Further, the substrate used for the growth of a p-type Zn(Mg,Cd,Be)O(S,Se) film can be electrically resistive or conductive, depending on the specific use of the p-type Zn(Mg,Cd,Be)O(S,Se) film. If it is grown for characterizing the electrical properties of the p-type Zn(Mg,Cd,Be)O(S,Se) film itself, sometimes a highly resistive substrate is preferred according to the characterization method. In most circumstances, the p-type Zn(Mg,Cd,Be)O(S,Se) films are grown for uses in semiconductor devices, including but not limited to LEDs or laser diodes (LDs), and electrically conductive substrates are likely preferred.

Figure 3:
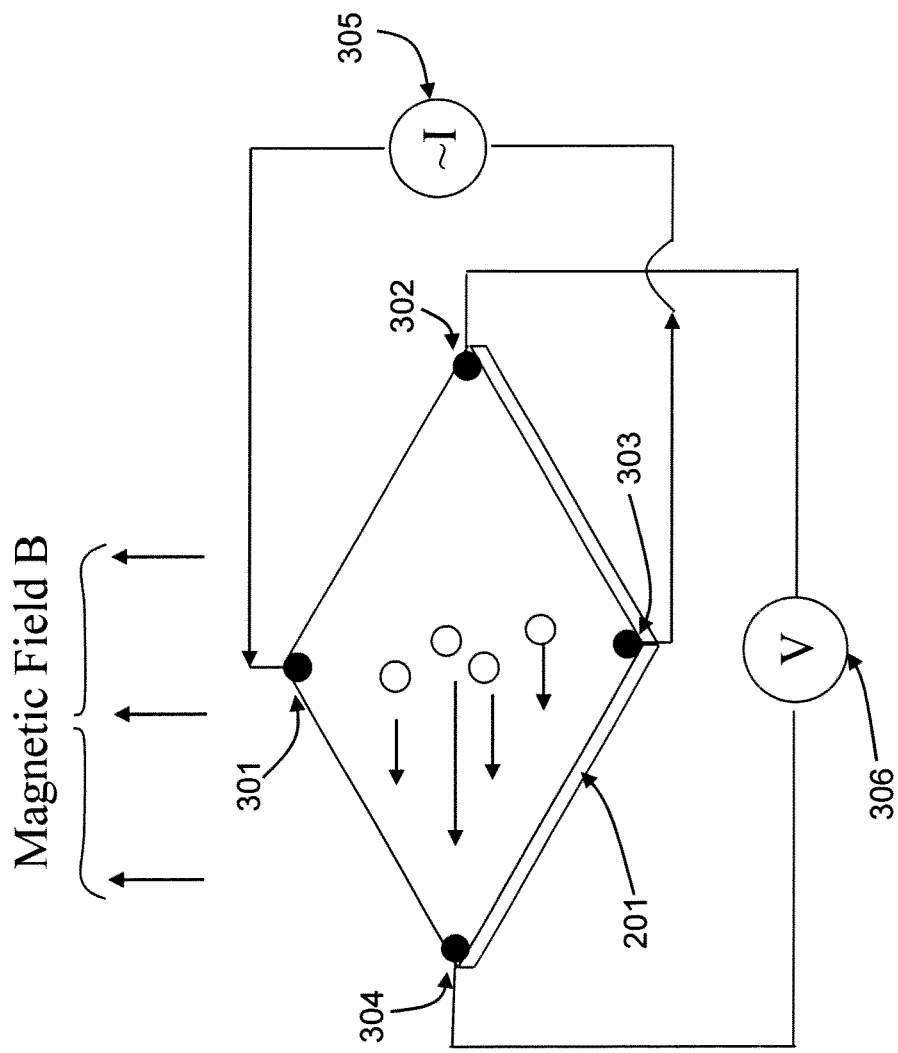
FIG. 3 schematically shows the operational principle of the Hall measurement.

In another aspect, the conduction type and the majority carrier concentration of a semiconductor film can be measured according to the Hall Effect (*The Hall Effect and Related Phenomena*, E. H. Putley, Butterworths, London (1960), incorporated by reference herein). The fundamental principle of the measurement can be understood by referring to FIG. 3 that schematically shows an experimental set-up for the Hall Effect measurement. For this measurement, an electrical current source 305 provides a constant measurement current from a contact 301 to a contact 303 on the semiconductor film 201 under measurement. Meanwhile a magnetic field, B, is applied perpendicular to the film 201 and the measurement current. Then, the conduction type and the majority carrier concentration can be determined by measuring the polarity and the magnitude of the potential drop 306 between the contact pair 302 and 304. If the film 201 is a p-type, or in other words, holes are the majority carriers in the film 201, the Lorentz force moves the positively charged holes towards the side of the contact 304, resulting in hole accumulation in the vicinity of the contact 304 and, therefore, a positive potential drop can be measured from the contact 304 to the contact 302. Vice versa, a negative potential drop from the contact 304 to the contact 302 can be measured if the film 201 under measurement is n-type.

Figure 4:
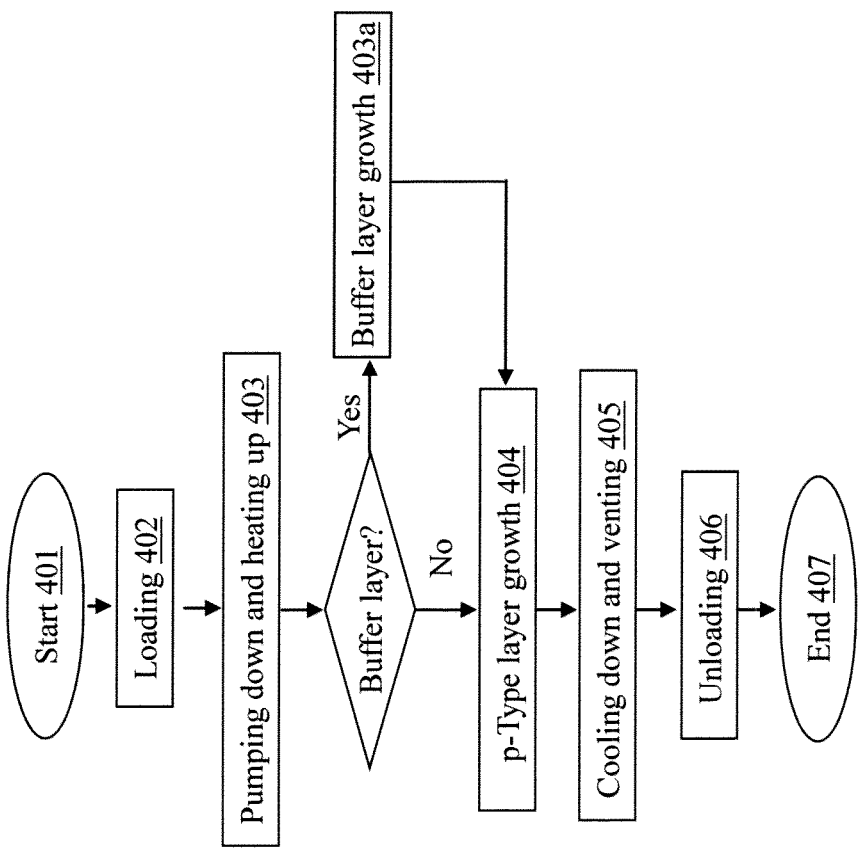
FIG. 4 is a flow chart describing procedures used in forming a p-type Zn(Mg,Cd,Be)O(S,Se) film using MOCVD.

In more detail, the flow chart in FIG. 4 shows one procedure suitable for growth of a single p-type Zn(Mg,Cd,Be)O (S,Se) film using said MOCVD method in accordance with aspects of the invention. In block 401, the MOCVD system should be placed in the "Ready" state and said substrate 103 should also be made ready for a growth run. Unless of a commercial "epi-ready" type, the substrate 103 may experience a cleaning procedure that may or may not comprise mechanical and solvent cleanings to remove possible particles, greases, and any other foreign materials on the surface of the substrate 103. In block 402, the MOCVD system is switched to the status for substrate loading and the substrate 103 is loaded onto the susceptor 104 through the reactor door 102. In block 403, the reactor chamber 101 is filled up to or pumped down to the growth pressure and the substrate 103 is heated to the growth temperature. The growth pressure and temperature are preferably 76 torr and 500° C., respectively. But in various embodiments any other pressures larger than $10^{-6}$ torr and other temperatures in between 200° C. and 1500° C. may be used for the MOCVD method, and in some embodiments the growth pressure is greater than 1 torr, in some embodiments the growth temperature is between 250° C. and 1100° C., and in some embodiments the growth pressure is greater than 1 torr and the growth temperature is between 250° C. and 1100° C. But in various embodiments any other pressures larger than $10^{-6}$ torr and other temperatures in between 200° C. and 1500° C. may be used for the MOCVD method, and in some embodiments the growth pressure is greater than 1 torr, in some embodiments the growth temperature is between 250° C. and 1100° C., and in some embodiments the growth pressure is greater than 1 torr and the growth temperature is between 250° C. and 1100° C. A thin buffer layer 202 may be grown in situ using the MOCVD system if necessary, which is indicated in block 403a. The thickness of the buffer layer 202 is preferably less than 200 nm, but could be thicker. This thin buffer layer 202 may comprise any of the nitride semiconductors satisfying the formula $Al_xGa_yIn_{1-x-y}N$, inclusive of x=0, y=0, and x=y=0. Zn(Mg,Cd,Be)O(S,Se), silicon, germanium, silicon nitride, silicon oxide, silicon carbide, or the like. In block 404, precursor gases, and in some embodiments dopant source, are injected into the reactor chamber 101 along with the p-type dopant gas, and then the p-type Zn(Mg,Cd,Be)O(S,Se) layer 201 starts to grow on the thin buffer layer 202. This p-type Zn(Mg,Cd,Be)O(S,Se) layer 201 may also be grown directly on the substrate 103 without the thin buffer layer 202. A number of precursors can be used for the growth of the p-type Zn(Mg,Cd,Be)O(S,Se) layer 201, for example the precursors may comprise one or more of diethylzinc (DEZn), dimethylzinc (DMZn), bis(cyclopentadienyl)magnesium ($Cp_2Mg$), bis(methylcyclopentadienyl)magnesium ($MeCp_2Mg$), dimethylcadmium (DMCd), diethylcadmium (DECd), dimethyl beryllium (DMBe), diethylberyllium (DEBe), $O_2$, $O_3$, $H_2O$, $H_2O_2$, alcohols, $N_2O$, $H_2S$, $H_2Se$, and the like. The dopant source is preferably a diluted gas containing $SiH_4$ with a concentration in the range of 50 ppm. The gases (including the precursors and the dopant source) in the reactor chamber 101 react at said growth temperature and pressure, resulting in the p-type Zn(Mg,Cd,Be)O(S,Se) film 201 formed on said thin buffer layer 202 or on said substrate 103 directly. The precursors and the dopant source may be turned off to end the film growth after the desired thickness is reached. In block 405, the reactor temperature cools down to less than 100° C. and the reactor chamber 101 is vented to atmospheric pressure for unloading. Usually before venting to atmospheric pressure, the reactor chamber 101 should experience a pump/purge process to reduce residual precursors and doping source contents. This pump/purge process should contain several cycles (e.g. 3 or more cycles) of pumping down to a low pressure (e.g. 76 torr) and purging with nitrogen, or another appropriate gas, to a high pressure (e.g. 750 torr). In block 406, the wafer 200 with the grown p-type Zn(Mg,Cd, Be)O(S,Se) film 201 is unloaded through the reactor door 102.

In some embodiments, an activation process may be used to remove possible passivations, such as caused by hydrogen, in the as-grown Zn(Mg,Cd,Be)O(S,Se) semiconductor doped for p-type conduction. This is typically done with a thermal annealing process in which said as-grown Zn(Mg,Cd,Be)O (S,Se) semiconductor is heated up to an elevated temperature between 300° C. and 1300° C. A rapid thermal annealing furnace, preferably with nitrogen or oxygen purge, is preferred for the annealing process: however other types of heating apparatus, including tube furnaces, may also be used. Besides said thermal activation process, for those knowing the skills of the art, other methods such as electron-beam irradiation, plasma heating, or the like may also be used to activate the acceptors in said as-grown Zn(Mg,Cd,Be)O(S, Se) semiconductor.

A p-type ZnO film sample was formed on an n-type silicon substrate using said MOCVD method and was measured by said Hall measurement method at room temperature (RT). Table 1 of FIG. 5 includes data of four Hall measurements with measurement currents of 1, 2, 4, and 8 μA, respectively. All four measurements yielded a consistent result that the sample is a p-type semiconductor. As indicated from the table, the sample has an average hole concentration of 9.43×$10^{17}$ cm$^{-3}$, an average resistivity of 3.25 ohm·cm, and an average mobility of 2.08 cm$^2$/V·s.

Another p-type ZnO film sample was formed using said MOCVD method with the same growth procedure as used for the previous sample mentioned in the last paragraph. However a highly resistive substrate was used for the sample growth instead, which could improve the Hall measurement accuracy. Table 2 of FIG. 6 tabulates data of three Hall measurements at RT from the p-type ZnO sample with measurement currents of 10, 50, and 100 μA, respectively. All three measurements unanimously confirmed the p-type conduction of this sample that was formed in accordance with the spirit of this invention. The average hole concentration, resistivity, and mobility are 2.1×$10^{18}$ cm$^{-3}$, 0.447 ohm·cm, and 6.64 cm$^2$/V·s, respectively. These values are somewhat different from those shown in Table 1, but the deviations are acceptable for doping experiments using the MOCVD process. A possible cause could be a removal of parasitic growth coating on the reactor walls, which took place between the two growth runs yielding the data of Table 1 and Table 2. This may have resulted in the drift of some growth conditions such as temperature profile in the reactor chamber 101.

Although the present invention has been described in considerable detail with reference to the MOCVD method, other methods may also be utilized to form said p-type Zn(Mg,Cd,Be)O(S,Se) in accordance with the spirit of this invention. These methods include, but are not limited to ion implantation, diffusion, laser ablation, evaporation, chemical vapor deposition (CVD), mass transport, molecular beam epitaxy (MBE), pulsed laser deposition (PLD), liquid phase epitaxy (LPE), hydride vapor phase epitaxy (HYPE), and a number of bulk crystal growth methods including vapor phase growth, hydrothermal growth, or melt growth. Accordingly, the invention should be considered the novel and non-obvious claims supported by this disclosure, and their insubstantial variations.

What is claimed is:

1. A p-type group II-VI semiconductor Zn(Mg,Cd,Be)O(S,Se) comprising mainly the groups II and IIA elements and the group VI elements in the Periodic Table of Elements, said semiconductor containing at least two elements in the group IV of the Periodic Table of Elements as a p-type impurity, wherein said group IV elements refer to C, Si, Ge, Sn, or Pb and said group IV elements have a concentration within a range of 1×$10^{13}$~1×$10^{22}$ cm$^{-3}$ in said p-type group II-VI semiconductor Zn(Mg, Cd,Be)O(S,Se).

2. The p-type group II-VI semiconductor Zn(Mg,Cd,Be)O(S,Se) of claim 1, wherein said Zn(Mg, Cd,Be)O(S,Se) represents any of the group II-VI semiconductors satisfying a formula $Zn_{1-a-b-c}Mg_aCd_bBe_cO_{1-p-g}S_pSe_q$, wherein a=0~1, b=0~1, c=0~1, p=0~1, and q=0~1.

3. The p-type group II-VI semiconductor Zn(Mg, Cd,Be)O(S,Se) of claim 1, wherein said p-type group II-VI semiconductor Zn(Mg, Cd,Be)O(S,Se) is formed by doping said group IV elements using a method comprising at least one of ion implantation, diffusion, laser ablation, evaporation, chemical vapor deposition (CVD), mass transport, epitaxial growth methods including molecular beam epitaxy (MBE), metalorganic chemical vapor deposition (MOCVD), pulsed laser deposition (PLD), liquid phase epitaxy (LPE), vapor phase epitaxy (VPE), and hydride vapor phase epitaxy (HYPE), and bulk crystal growth methods including vapor phase, hydrothermal, and melt growth methods.

4. The p-type group II-VI semiconductor Zn(Mg, Cd,Be)O(S,Se) of claim 1, wherein said semiconductor is crystalline or polycrystalline.

5. The p-type group II-VI semiconductor Zn(Mg, Cd,Be)O(S,Se) of claim 1, wherein said semiconductor is amorphous.

6. The p-type group II-VI semiconductor Zn(Mg, Cd,Be)O(S,Se) of claim 1 wherein said semiconductor is a p-type group II-VI semiconductor bulk.

7. The p-type group II-VI semiconductor Zn(Mg, Cd,Be)O(S,Se) of claim 6 wherein the bulk has a regular shape.

8. The p-type group II-VI semiconductor Zn(Mg, Cd,Be)O(S,Se) of claim 6 wherein the bulk has an irregular shape.

9. The p-type group II-VI semiconductor Zn(Mg, Cd,Be)O(S,Se) of claim 1, wherein said semiconductor is a p-type group II-VI semiconductor film.

10. The p-type group II-VI semiconductor Zn(Mg, Cd,Be)O(S,Se) of claim 9, wherein said p-type group II-VI semiconductor film is on a substrate comprising diamond, sapphire, Si, SiC, $Si_xGe_{1-x}$ (where x=0~1), Ge, Zn(Mg, Cd,Be)O(S,Se), $ZrO_2$, $LiAl_xGa_{1-x}O_2$ (where x=0~1), $SrTiO_3$, $MgAl_2O_4$, $ScAlMgO_4$, $Al_{1-x-y}In_xGa_yN$ (where x=0~1, y=0~1), InP, GaAs, quartz, or glass.

11. The p-type group II-VI semiconductor Zn(Mg, Cd,Be)O(S,Se) of claim 9, wherein said p-type group II-VI semiconductor film is on a compliant substrate.

* * * * *